United States Patent [19]
Kawaguchi et al.

[11] Patent Number: 4,759,021
[45] Date of Patent: Jul. 19, 1988

[54] TEST PATTERN GENERATOR

[75] Inventors: Ikuo Kawaguchi; Masaaki Inadachi; Shuji Kikuchi, all of Yokohama, Japan

[73] Assignee: Hitachi, Ltd., Tokyo, Japan

[21] Appl. No.: 920,986

[22] PCT Filed: Jan. 31, 1986

[86] PCT No.: PCT/JP86/00039
§ 371 Date: Sep. 30, 1986
§ 102(e) Date: Sep. 30, 1986

[87] PCT Pub. No.: WO86/04686
PCT Pub. Date: Aug. 14, 1986

[30] Foreign Application Priority Data
Jan. 31, 1985 [JP] Japan .................. 60-15339
Mar. 5, 1985 [JP] Japan .................. 60-41898

[51] Int. Cl.$^4$ .................................. G06F 11/22
[52] U.S. Cl. ............................. 371/27; 371/25
[58] Field of Search ............. 371/27, 25, 20, 21; 364/200, 900

[56] References Cited
U.S. PATENT DOCUMENTS

| | | | |
|---|---|---|---|
| 4,369,511 | 1/1983 | Kimura | 371/25 |
| 4,389,727 | 6/1983 | Nigorikawa | 371/27 |
| 4,547,861 | 10/1985 | Lauiron | 371/27 |
| 4,639,919 | 1/1987 | Chang | 371/27 |
| 4,670,879 | 6/1987 | Okino | 371/27 |

Primary Examiner—Michael R. Fleming
Attorney, Agent, or Firm—Antonelli, Terry & Wands

[57] ABSTRACT

In a semiconductor testing device of LSI or the like, a high-speed small-capacity memory (50) is provided in addition to low-speed large-capacity memories (11~14) for interleave operation, and test patterns after a branch operation are previously stored in the memory (50). When test patterns are to be read in sequence the reading is performed from the low-speed large-capacity memories (11~14), and when branch is produced in the reading sequence the changing is performed to the high-speed small-capacity memory (50) and the test patterns are read from the high-speed small-capacity memory (50) until the reading from the low-speed large-capacity memories (11~14) again becomes possible. Thereby, the test patterns of a large number can be outputted without generating a dummy cycle.

6 Claims, 10 Drawing Sheets

TEST PROGRAM

| ADDRESS | SEQUENCE CONTROL INSTRUCTION | TEST PATTERN |
|---|---|---|
| 0 | NOP | 0 0 0 0 |
| 1 | NOP | 0 0 0 1 |
| 2 | JUMP 9 | 0 0 1 1 |
| 3 | NOP | 0 0 1 0 |
| 4 | NOP | 0 1 1 0 |
| 5 | NOP | 0 1 1 1 |
| 6 | NOP | 0 1 0 1 |
| 7 | NOP | 0 1 0 0 |
| 8 | NOP | 1 1 0 0 |
| 9 | JUMP 13 | 1 1 1 1 |
| 10 | NOP | 1 1 1 0 |
| 11 | NOP | 1 0 1 0 |
| 12 | NOP | 1 0 1 1 |
| 13 | NOP | 1 0 0 1 |
| 14 | NOP | 1 0 0 0 |
| 15 | NOP | 1 0 0 0 |

LOW SPEED MEMORY 11

| CORRESPONDING ADDRESS | TEST PATTERN |
|---|---|
| 0 | 0 0 0 0 |
| 4 | 0 1 1 0 |
| 8 | 1 1 0 0 |
| 12 | 1 0 1 0 |

LOW SPEED MEMORY 12

| CORRESPONDING ADDRESS | TEST PATTERN |
|---|---|
| 1 | 0 0 0 1 |
| 5 | 0 1 1 1 |
| 9 | 1 1 0 1 |
| 13 | 1 0 1 1 |

LOW SPEED MEMORY 13

| CORRESPONDING ADDRESS | TEST PATTERN |
|---|---|
| 2 | 0 0 1 1 |
| 6 | 0 1 0 1 |
| 10 | 1 1 1 1 |
| 14 | 1 0 0 1 |

LOW SPEED MEMORY 14

| CORRESPONDING ADDRESS | TEST PATTERN |
|---|---|
| 3 | 0 0 1 0 |
| 7 | 0 1 0 0 |
| 11 | 1 1 1 0 |
| 15 | 1 0 0 0 |

HIGH SPEED MEMORY 50

| COMPRESSED ADDRESS | CORRESPONDING ADDRESS | TEST PATTERN | CORRESPONDING ADDRESS | TEST PATTERN | CORRESPONDING ADDRESS | TEST PATTERN |
|---|---|---|---|---|---|---|
| 0 | 9 | 1 1 0 1 | 10 | 1 1 1 1 | 11 | 1 1 1 0 |
| 1 | 13 | 1 0 1 1 | 14 | 1 0 0 1 | 15 | 1 0 0 0 |
| 2 | | | | | | |
| 3 | | | | | | |

| FORWARD BRANCH | WAIT COUNT CALCULATION |
|---|---|
| (K-1) → (K) → (K+1) ⋯ (L) | INHERENT WAIT COUNT $= N - \left[\dfrac{L-(K+1)}{N}\right]_{mod}$<br><br>ASSUMPTION $\begin{cases} 1: L > K \\ 2: N \text{ WAY INTERLEAVE} \end{cases}$ |
| BACKWARD BRANCH | WAIT COUNT CALCULATION |
| (J) ⋯ (K-1) → (K) → (K+1) | INHERENT WAIT COUNT $= \left[\dfrac{(K+1)-J}{N}\right]_{mod}$<br><br>ASSUMPTION $\begin{cases} 1: J < K \\ 2: N \text{ WAY INTERLEAVE} \end{cases}$ |

FIG. 9

FIG. 10

TEST PATTERN GENERATOR

BACKGROUND OF THE INVENTION

The present invention relates to semiconductor testing devices of LSI or the like, and more particularly to a test pattern generator wherein a large number of test patterns to be used in testing of a micro processor or the like are favorably generated at high speed.

In general, in testing of a logic LSI of a micro processor or the like, test patterns are previously stored in a memory of the testing device and then read at high speed, and thereby the test patterns are generated.

Since micro processors with high speed and high function have been developed in recent years, a large number of test patterns must be generated at very high speed in the testing thereof. In order to read the test patterns at high speed using a memory of low speed and large capacity, an interleave operation is known as the most effective means. As a test pattern generator using this means, for example, a device disclosed in Japanese patent application laid-open No. 128646/1979 is known. In testing of a logic LSI or the like, not only the test patterns are read in sequence, but also a function of reading one test pattern repeatedly and a function of branching the reading sequence are required. In the above-mentioned example of the prior art, in order to obtain these functions, a low-speed large-capacity memory is operated in an interleave manner and the output is stored in a high-speed small-capacity memory, and the repeated reading or the branch reading is performed. In this arrangement, however, since branching beyond the capacity of the high-speed memory is impossible, the test patterns cannot be read in an entirely arbitrary sequence.

SUMMARY OF THE INVENTION

An object of the invention is to provide a test pattern generator wherein test patterns of a large number can be read and generated at high speed in an arbitrary sequence.

The invention is characterized in that a high-speed small-capacity memory is provided in addition to a low-speed large-capacity memory operating in an interleave manner, test patterns after branch are previously stored in the memories, when the test patterns are to be read in sequence they are read from the low-speed large-capacity memory, and when a branch is produced in the reading sequence the reading is changed to the high-speed small-capacity memory and the test patterns are read from the high-speed small-capacity memory until the reading from the low-speed large-capacity memory agains becomes possible.

DESCRIPTION OF THE PREFERRED EMBODIMENTS

An embodiment of the invention will now be described with reference to the accompanying drawings.

Figure 1:
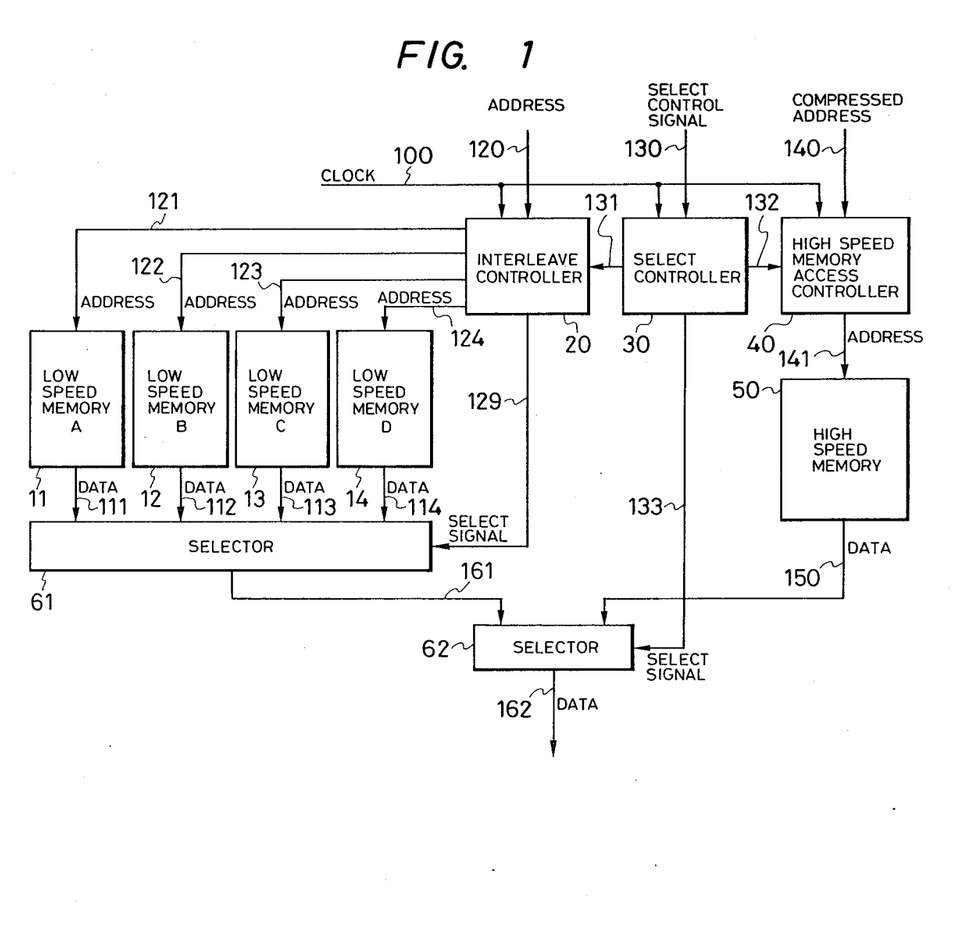
FIG. 1 is a schematic block diagram of a test pattern generator as an embodiment of the invention.

FIG. 1 is an overall block diagram of a test pattern generator. The test pattern generator in the embodiment comprises four low-speed large-capacity memories 11, 12, 13, 14 and a high-speed small-capacity memory 50, an interleave controller 20 and a selector 61 for controlling interleave operation of the low-speed large-capacity memories 11, 12, 13, 14 so as to read data from the low-speed large-capacity memories 11, 12, 13, 14 and the high-speed small-capacity memory 50, and a high-speed memory access controller 40 which performs control to read data from the high-speed small-capacity memory 50 when a branch occurs in the reading. The test pattern generator further comprises a select controller 30 and a selector 62 which change the data reading from the side of the low-speed large-capacity memories 11, 12, 13, 14 to the side of the high-speed small-capacity memory 50 until the data reading from the low-speed large-capacity memories 11, 12, 13, 14 again becomes possible during the branch operation.

Figure 2:
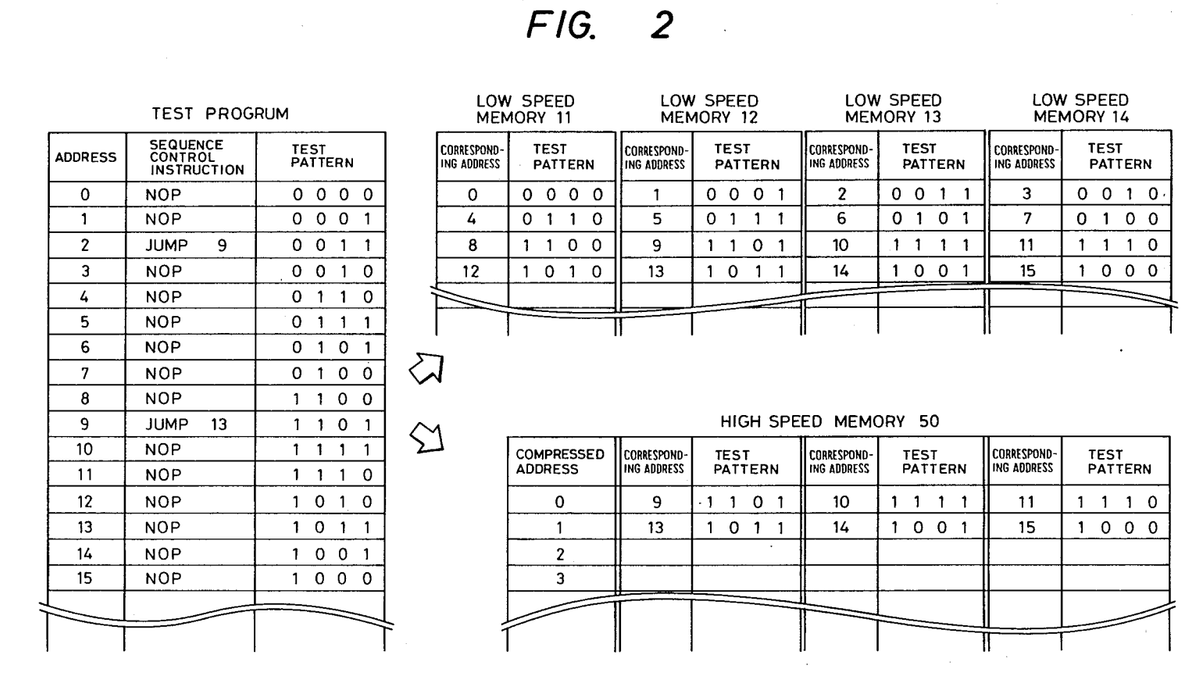
FIG. 2 is a diagram illustrating information stored in memories shown in FIG. 1.

FIG. 2 shows an example of test patterns stored in the low-speed large-capacity memories and the high-speed small-capacity memory. The test program shown in FIG. 2 is composed of test patterns stored in the memories 11, 12, 13, 14, 50 and a sequence instruction to control the reading sequence, where the sequence instruction NOP indicates advancing to a subsequent address, and JUMP indicates a branch. In the example of FIG. 2, test patterns corresponding to each address in sequence of address 0-1-2-9-13-14-15- . . . are read and generated. When such test patterns are stored in the embodiment shown in FIG. 1, results are as shown in FIG. 2.

That is, since the interleave operation is performed in the case of low-speed memories, test patterns corresponding to each address 0, 1, 2, 3 are stored in sequence of the low-speed large-capacity memories 11, 12, 13, 14.

Since the high-speed memory is used only during the branch operation, test patterns at a branch place corresponding to the JUMP instruction of the test program, test patterns of addresses 9, 13 in this example shown in the figure, are stored. The reading from the high-speed memory continues after the branch is executed until the reading from the low-speed memories again becomes possible. That is, since the 4-way interleave operation of the low-speed memories is performed in the embodiment shown in FIG. 1, the reading from the low-speed memories becomes possible after 4 cycles at most from the branch execution. Consequently, in the embodiment, test patterns corresponding to 3 cycles after the branch are stored in the high-speed memory. As shown in FIG. 2, since branch to address 9 and branch to address 13 exist in the test program, test patterns of addresses 9, 10, 11 corresponding to branch to address 9 are stored and also test patterns of addresses 13, 14, 15 corresponding to address 13 are stored in the high-speed memory.

In this way, when data is read in sequence from continuous addresses, it is read from the low-speed large-capacity memories in the interleave operation. When a branch is produced, data is read from the high-speed small-capacity memory until data becomes to be read again from the low-speed large-capacity memories. This reading operation will be described referring to FIG. 3.

Figure 3:
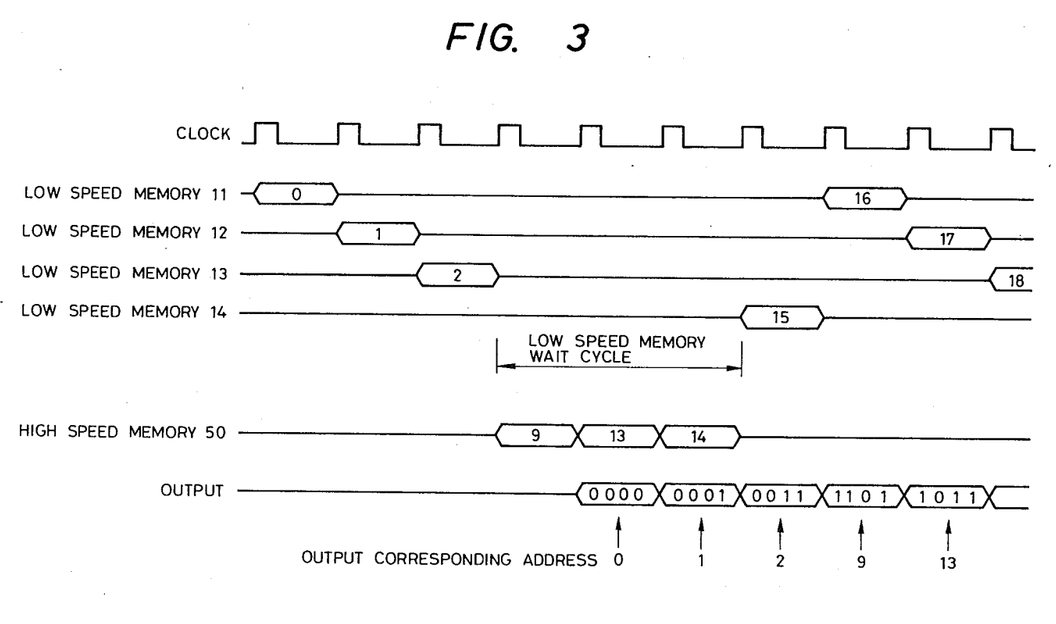
FIG. 3 is a diagram illustrating operation of the generator shown in FIG. 1.

Since addresses 0-1-2 generated according to the test program example shown in FIG. 2 are continuous addresses, access is performed in the low-speed memories 11, 12, 13 in sequence. Since a branch is produced in the next address 9, the low-speed memories are in a wait state (WAIT Cycle) and access is performed in changing to the side of the high-speed memory 50. Since the next address 13 is also a branch, access is still performed from the high-speed memory 50.

Test patterns to be read next are that of address 14. Low-speed memory in the order capable of being read in this state is the low-speed large-capacity memory 14, but test patterns corresponding to address 14 are not stored in the low-speed large-capacity memory 14 (refer to FIG. 2). Consequently, the reading of test patterns of address 14 is still performed from the high-speed small-capacity memory 50.

Test patterns corresponding to the address 15 to be read out next are stored in the low-speed large-capacity memory 14. Consequently, after this cycle, the test patterns can be read in sequence again from the side of the low-speed large-capacity memories. Addresses 15, 16, 17, . . . are read out from the low-speed large-capacity memories 14, 11, 12, . . . in sequence. Since the low-speed memories are operated in an interleave manner, output of the test patterns is delayed by several cycles from the access starting.

Feature of the invention as above described is in the decision regarding whether or not the reading from the low-speed memories is possible and its changing control.

In FIG. 1, numeral 100 designates clock signals to be supplied to the interleave controller 20, the select controller 30 and the high-speed memory access controller 40, numerals 111, 112, 113, 114 designate output data from the low-speed large-capacity memories 11, 12, 13, 14 respectively, numeral 120 designates an address signal to be supplied to the interleave controller 20, numerals 121, 122, 123, 124 designate address signals from the interleave controller 20 to the low-speed large-capacity memories 11, 12, 13, 14 respectively, numeral 129 designates a select signal from the interleave controller 20 to the selector 61, numeral 130 designates a select control signal to be supplied to the select controller 30, numerals 131, 132 indicate select signals from the select controller 30 to the interleave controller 20 and the high-speed access controller 40 respectively, numeral 133 indicates a select signal from the select controller 30 to the selector 62, numeral 140 designates a compressed address signal to be supplied to the high-speed memory access controller 40, numeral 141 designates an address signal from the high-speed memory access controller 40 to the high-speed small-capacity memory 50, numerals 150, 161 indicate output data from the high-speed small-capacity memory 50 and the selector 61 respectively, and numeral 162 indicates output data from the selector 62.

Figure 4:
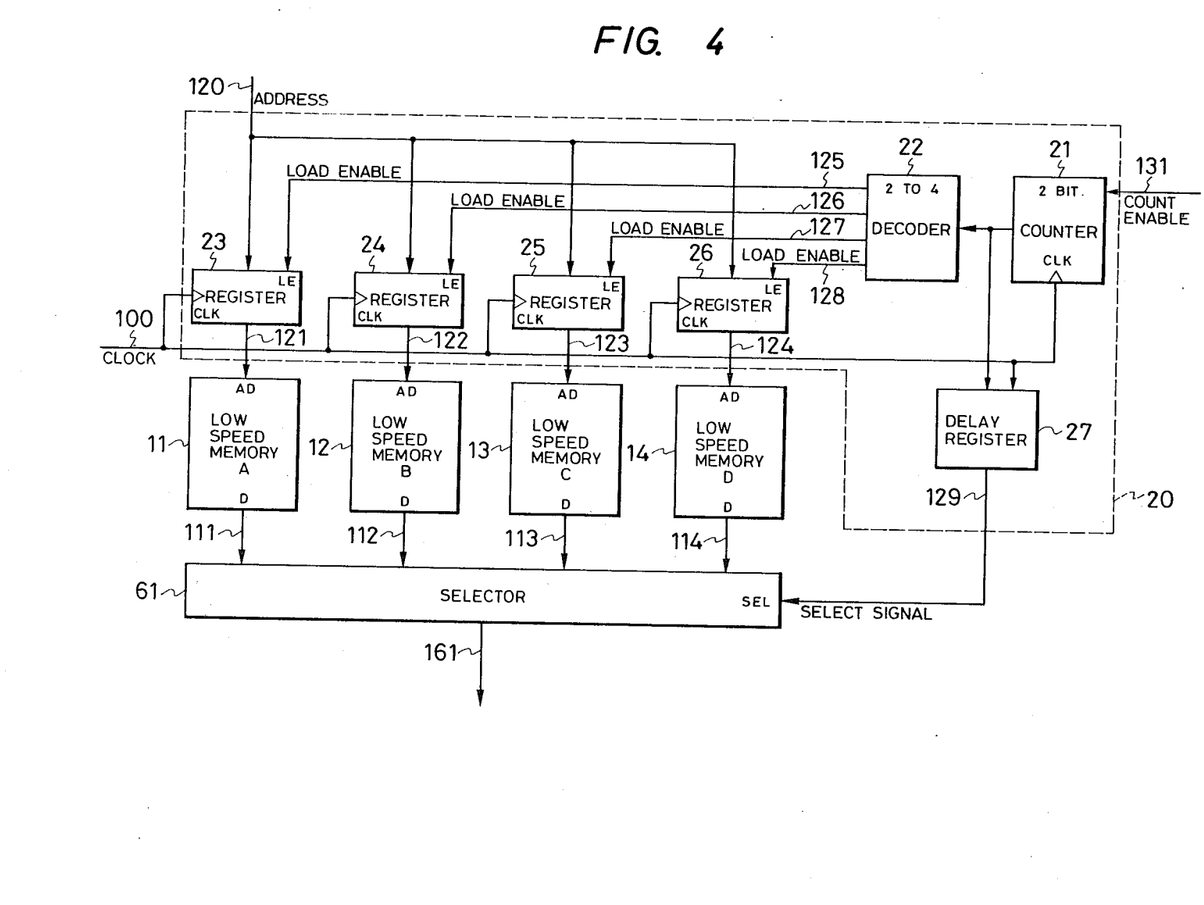
FIG. 4 is a detailed diagram at low-speed memory side shown in FIG. 1.
Figure 5:
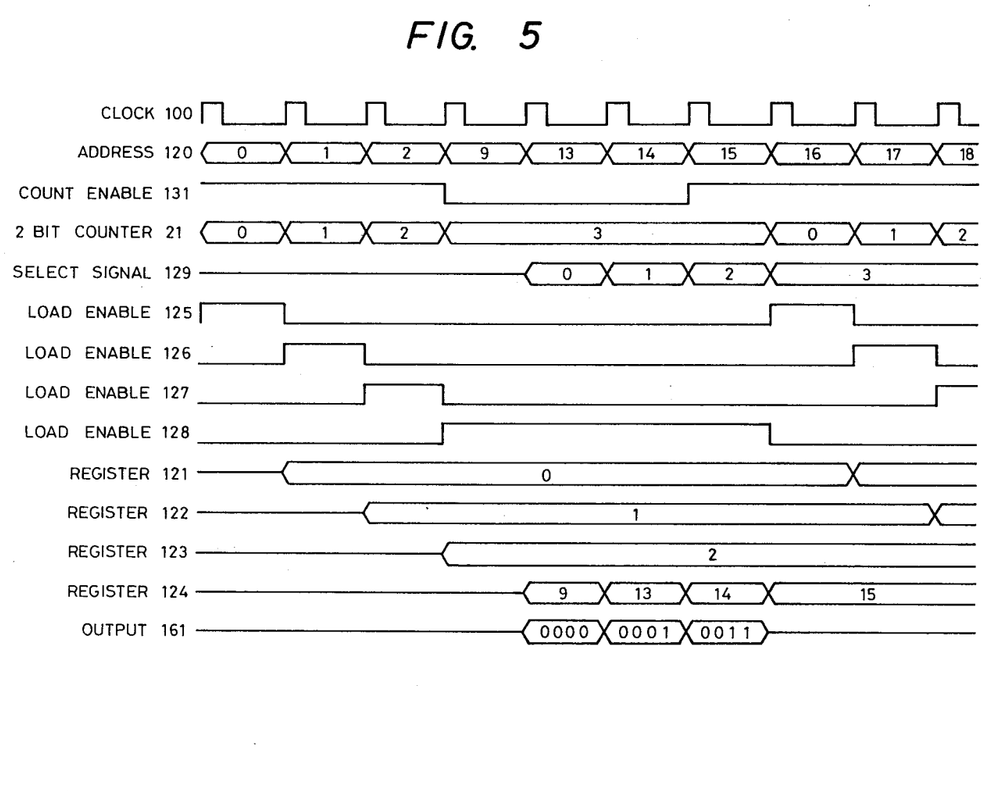
FIG. 5 is a detailed diagram illustrating operation of circuits shown in FIG. 4.

FIG. 4 is a detailed diagram of the interleave controller at the input side of the low-speed memories shown in FIG. 1, and FIG. 5 is a diagram illustrating its operation.

Since the low-speed large-capacity memories 11, 12, 13, 14 performing the 4-way interleave operation are shifted in access timing usually by one cycle from each other, the memories 11~14 are provided respectively with registers 23~26 each for holding an address.

Since the control of the registers 23~26 and the selector 61 is a 4-way interleave operation in this embodiment, it is performed by a counter 21 of two bits. Lead enable control signals 125~128 to the registers 23~26 are outputs of the counter 21 decoded by a decoder 22. Select signal 129 to the selector 61 is output from the counter 21 delayed by a delay register 27. Count enable control signal 131 to the counter 21 controls the interleave operation of the low-speed memories for the wait state (WAIT cycle).

Figure 6:
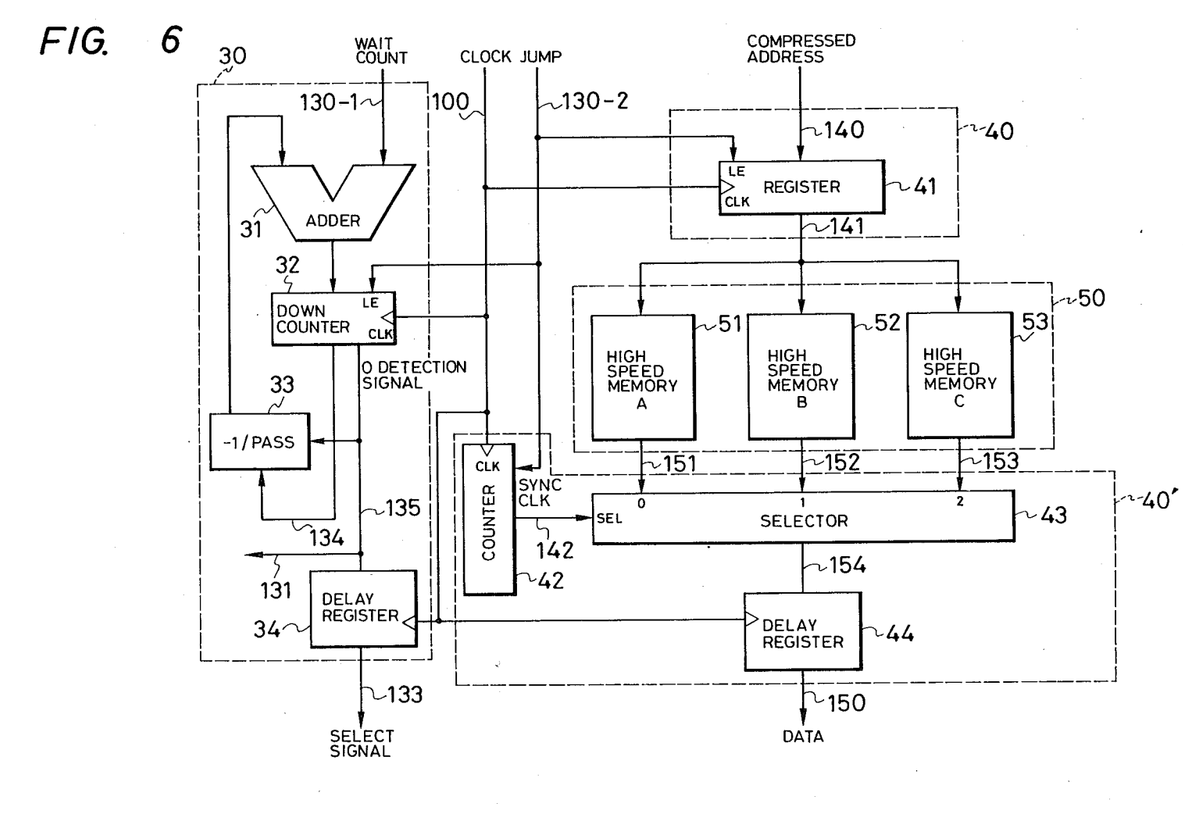
FIG. 6 is a detailed diagram at high-speed memory side shown in FIG. 1.
Figure 7:
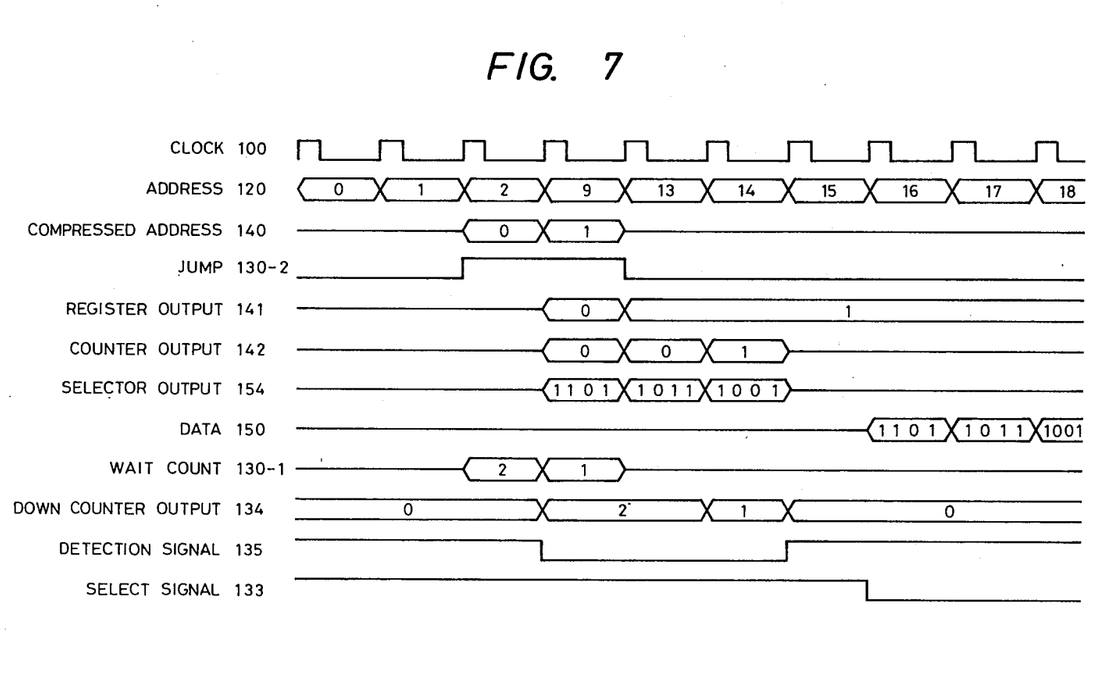
FIG. 7 is a detailed diagram illustrating operation of circuits shown in FIG. 6.

FIG. 6 is a detailed diagram of the select controller 30 and access controller 40 on the high-speed memory control side, and FIG. 7 is a diagram illustrating the operation thereof. In the embodiment performing the 4-way interleave operation as above described, after the branch, data of test patterns can be read from the high-speed memory continuously for three cycles at most. Consequently, the high-speed memory is composed of three high-speed memories 51, 52, 53, and output of each of the high-speed memories 51, 52, 53 is selected in sequence by a selector 43 every time several cycles lapse after the branch operation. These high-speed memories 51, 52, 53 are subjected to address assignment by a register 41, and the content of the register 41 is updated to the next compressed address 140 by a JUMP signal 130-2 (This signal corresponds to the first signal 132 in this embodiment.) every time the branch is produced. The compressed address corresponds to each branch instruction.

In the circuit shown in FIG. 6, since the high-speed memory 50 is composed of the three high-speed memories 51, 52, 53, a high-speed memory output selection circuit 40' is provided although it is not shown separately in FIG. 1.

A counter 42 performs select assignment of the selector 43 by select signal 142, and is cleared by the JUMP signal 130-2 every time the branch is produced. A delay register 44 makes timing of outputs 151, 152, 153 of the high-speed memories 51, 52, 53, i.e., timing of output 154 of the selector 43, match with output timing of the above-mentioned low-speed memories.

A down counter 32 of the select controller 30 outputs 0 in a normal state. When output 134 of the down counter 32 is 0, −1/PASS circuit 33 outputs 0 as it is. When the output 134 is not 0, the −1/PASS circuit 33 outputs a value processed by −1. When the branch is produced, if the value of the down counter 32 is 0, an adder 31 loads a WAIT count 130-1 which is inherent to the branch operation as it is to the down counter 32. The down counter performs a down count until the value becomes 0 at subsequent cycles. During the branch operation, if the output value 134 of the down counter 32 is not 0 (at continuous branch), the value processed by −1 is added to the WAIT count inherent to the branch operation by the adder 31 and the resulting value is loaded into the down counter 32. When the value of the down counter 32 is 0, a 0-detecting signal (the same signal as the count enable signal 131 in FIG. 1) is outputted. Changing of the high-speed memory and the low-speed memory is performed using the 0-detecting signal 135. The delay register 34 makes the output timing of the memory match the changing timing.

Figure 8:
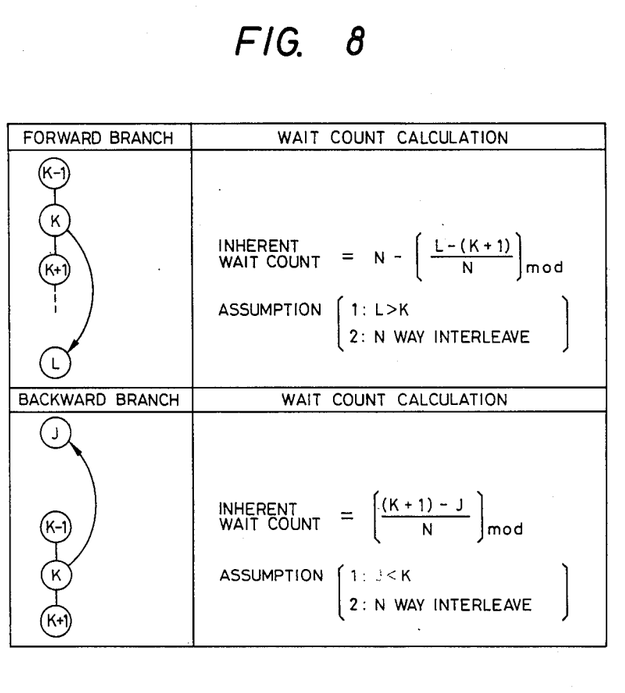
FIG. 8 is a digram illustrating calculation of WAIT count.

FIG. 8 is a diagram illustrating the calculation method of the WAIT count inherent to the branch operation used in FIG. 6 and FIG. 7. Since this embodiment shows the 4-way interleave operation as an example, it follows that N=4. Since K=2 and L=9 in the branch from address 2 to address 9, the wait count inherent to the branch operation becomes $$
\begin{aligned}
N &- [\{L - (K + 1)\}/N]\text{mod} \\
= 4 &- [\{9 - (2 + 1)\}/4]\text{mod} \\
= 4 &- [6/4]\text{mod} = 4 - 2 = 2
\end{aligned}
$$

where [A/B]mod represents a residual when A is divided by B.

In this embodiment, the WAIT count is corrected using the −1/PASS circuit 33 and the adder 31, thereby the continuous branch becomes possible. The WAIT count corrected at the continuous branch state is given by corrected WAIT count=residual WAIT count−1+inherent WAIT count As described in FIG. 6 and FIG. 7, the corrected WAIT count is calculated in real time so that the continuous branch also can be executed without a dummy cycle as clearly seen from the description of FIG. 6 and FIG. 7.

Although the interleave number is set to 4 ways in the embodiment, the number is not limited to this. The use of interleave control also is not limited to the embodiment. Although the embodiment discloses a method where the three memories are accessed in parallel as the high-speed memory in order to read the test patterns corresponding to three cycles, the method is not limited to this but distinction by address bit of one high-speed memory is possible.

According to the invention, the low-speed large-capacity memories storing the test patterns are operated in an N-way interleave manner and the test patterns after the branch operation are previously stored in the high-speed memory. When the branch operation is produced in this state, the necessary test patterns are read from the high-speed memory so that a pattern buffer of high speed and large capacity can be obtained. When the branch is produced and the patterns are read from the high-speed memory, the reading of patterns from the high-speed memory is still made possible until the reading of patterns from the low-speed large-capacity memories becomes possible, thereby even if random access is performed, a dummy cycle is not produced and the capacity of the buffer is not decreased to 1/N.

Figure 9:
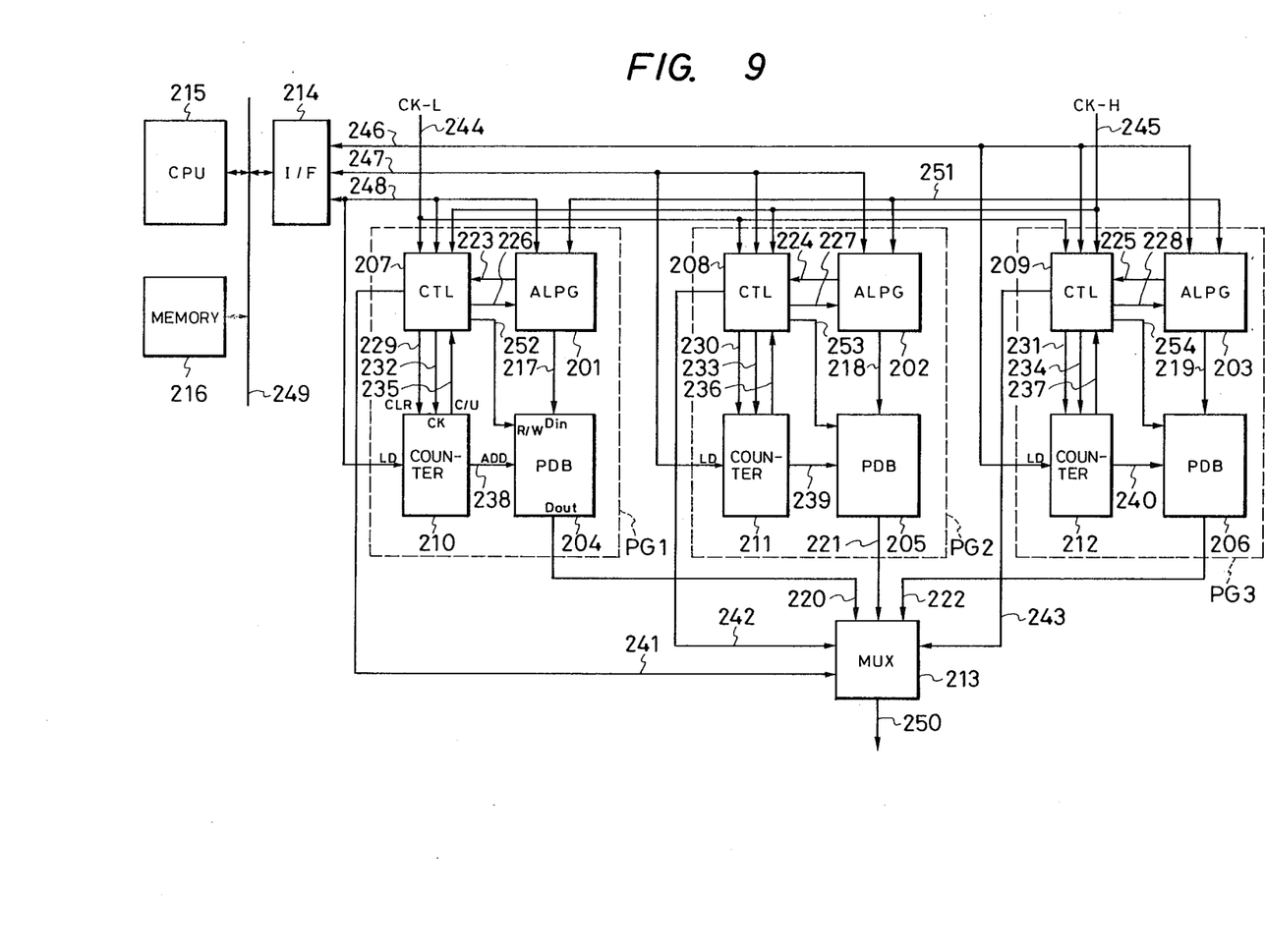
FIG. 9 is a schematic block diagram illustrating another embodiment of the invention.
Figure 10:
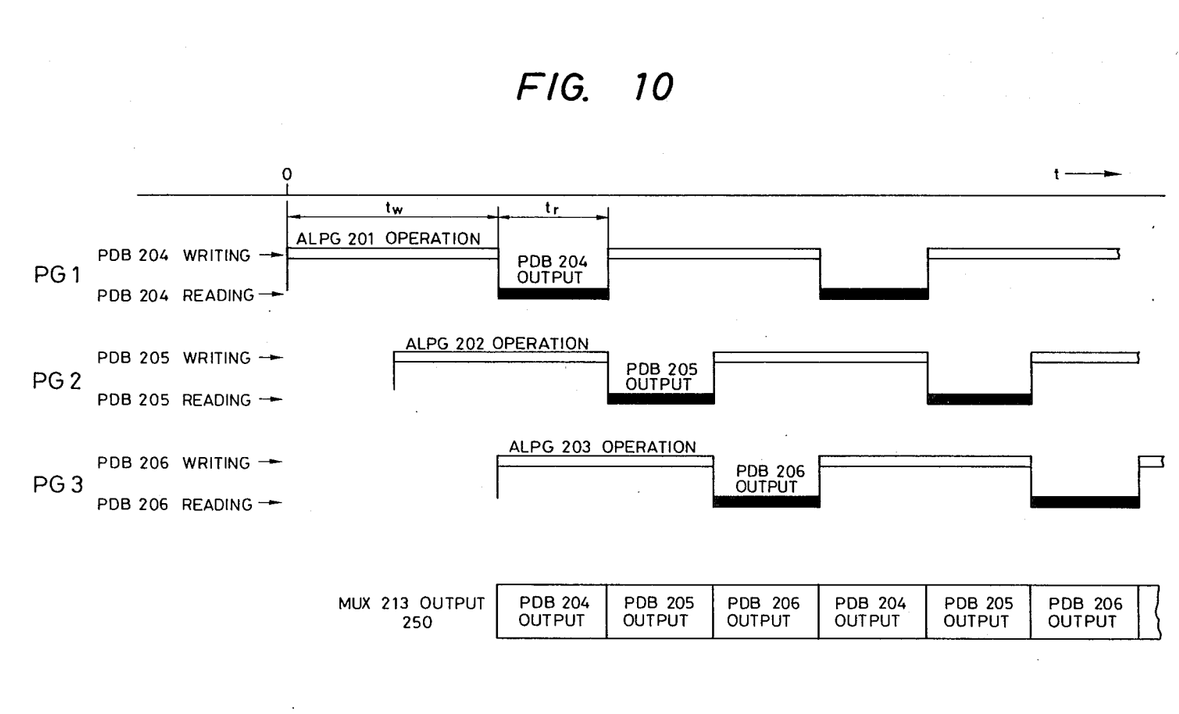
FIG. 10 is a diagram illustrating operation of the generator shown in FIG. 9.

Algorithmic pattern generator can be realized based on the idea of the embodiment. The pattern generator in this constitution will now be described. FIG. 9 is a diagram illustrating an embodiment of the algorithmic pattern generator, and FIG. 10 is a diagram illustrating its operation. That is, in the embodiment of FIG. 9, output patterns of the algorithmic pattern generator (hereinafter referred to as "ALPG") are first expanded and stored in a buffer memory and the interleave operation is performed using a combination of plural buffer memories thereby the high-speed pattern generation becomes possible without generating a dummy cycle.

The embodiment in FIG. 9 has three algorithmic pattern generating units PG1, PG2, PG3. The three units PG1, PG2, PG3 are operated by the interleave control system. The units PG1~PG3 comprise control circuits (CTL) 207~209, ALPG 210~203, counters 210~212, and memories (PDB) 204~206.

The algorithmic pattern generator has, in addition to the units PG1~PG3, a CPU 215, a memory 216, a common bus 249, an interface (I/F) 214, and a multiplexer (MUX) 213. Mutual communication of data and control signals is performed between the units PG1~PG3 and the CPU 215, the memory 216 through the common bus 249 and the I/F 214.

FIG. 10 shows a time chart of the interleave operation in writing and reading to the memories (PDB) 204~206 for expansion of data within the units PG1~PG3.

Since the units PG1~PG3 have the same constitution, the PG1 as representative unit will be described in detail. The ALPG 201 outputs algorithmic patterns by the microprogram control system. The PDB 204 stores the algorithmic patterns generated from the ALPG 201. The counter 210 is an addressing counter of the PDB 204. The CTL 207 controls the counter 207, the ALPG 201 and the MUX 213.

Further, a low-speed clock (CK-L) 244 and a high-speed clock (CK-H) 245 are selectively inputted from outside. The low-speed clock is used as a writing clock, and the high-speed clock is used as a reading clock.

In the ALPG having a feedback loop, high-speed operation by the pipeline seems difficult from the viewpoint of dummy cycle prevention. Consequently, the ALPG 201 is first operated using the low-speed clock (CK-L) 244, and the output pattern 217 is stored in the PDB 204. In the stored address 238 of the PDB 204, output 238 of the counter 210 cleared previously by clear input (CLR) 229 is made the first address, and counter outputs added in sequence by the low-speed clock (CK-L) 244 are made addresses, and outputs of the ALPG are inputted. Final address in this state is given from the LD input of the counter 210 through the CPU 215 and the I/F 214. When the counter value coincides with this address value, a count-up signal (C/U) 235 is outputted. The count-up signal (C/U) 235 outputs control signal 226 of the ALPG 201 through the CTL 207 and stops data output of the ALPG 201. At the same time as this operation, the CTL 207 generates the clear signal 229 and clears the counter 210, and simultaneously changes the clock input to the counter 210 from the low-speed clock 244 into the high-speed clock 245 and also changes the PDB 204 into a reading mode by the changing signal 252. And then the PDB 204 outputs the ALPG output pattern data from the PDB 204 according to the output address 238 of the counter 210 acting by the high-speed clock. In comparison to the ALPG 201 usually having a complicated constitution, the PDB 204 reading the data simply can be operated at several times the speed.

Entirely the same operation as above described is executed also regarding PG2, PG3. The units PG1, PG2, PG3 are stored for execution at phases by equally halving the ALPG operating time so that each of PG1, PG2, PG3 is operated in the interleave mode. FIG. 10 shows the operation timing, and the embodiment shows the case where the PDB operation speed is twice as large as the ALPG operation speed. That is, assuming that the writing time to the PDB is $t_w$ and the reading time from the PDB is $t_r$, it follows that $t_w=2t_r$. PG2 is started at a point delayed by $t_w/2$ from PG1, and PG3 is started at a point further delayed by $t_w/2$.

As above described, outputs from the PDB 204~206 are changed in sequence by the multiplexer MUX 213, so that the algorithmic pattern outputs 250 can be obtained continuously at the reading speed of the PDB.

Paying attention to PG1, after the first PDB 204 generates an output, the output pattern of a subsequently generating ALPG 201 is required to generate a pattern subsequent to the step number generated by the PDB 204~206. Consequently, data required for registers within the ALPG 201 is written to the time $t_r$ of PG1 from CPU 215. Algorithmic patterns are generated by performing processing during calculation according to a predetermined procedure. Before execution of the operation shown in FIG. 10, if any data is given to each of the ALPG 201~203 during each period of $t_r$, pattern generation by an amount corresponding to the PDB from midway beyond the step number given by the capacity of the PDB 204~206 becomes possible.

After all, with respect to a minimum n (n=2, 3, ...) satisfying a condition $(n \times t_r)=t_w$, the necessary number of the PG becomes n+1.

Although the data writing to registers within the ALPG during the period $t_r$ is performed from the CPU in the above description, it may be performed internally by the ALPG itself. On the other hand, although not shown in the embodiment, if the pattern generating speed is slow, a data output path is not formed in (ALPG+PDB), a so-called hybrid type as shown in the embodiment, but it may be formed so that the ALPG output directly becomes the PG output. Furthermore, if the counters 210~212 are not up-count but down-count, a similar operation is possible.

The PDB in the embodiment can be used as a memory to store and generate random pattern data for logic LSI testing in general, and also as a pattern generating system for both memory LSI and logic LSI. Consequently, the PDB has wide application field.

According to the invention, test patterns of high speed can be generated without generating a dummy cycle, and a test of the high-speed memory becomes possible. Then the low-speed large-capacity memories shown in the embodiment of FIG. 1 or the algorithmic pattern generating units shown in the embodiment of FIG. 9 can be increased or decreased at will, so that the most suitable test pattern generator can be constituted.

What is claimed is:

1. A test pattern generator, comprising:
first output means composed of a plurality of first memories for storing test patterns and for performing an interleave operation in the reading of test patterns, interleave controller means connected to said first memories for controlling the interleave operation of the first memories, and first selector means connected to said first memories for selectively outputting output data for the first memories;
a second output means composed of a second memory for storing test patterns, and memory access controller means for performing control to read the test patterns from the second memory when a branch in the reading is effected during reading of test patterns from the first memories of the first output means under control of said interleave controller means; and
changing select means composed of a select controller for controlling said interleave controller means of the first output means and the memory access controller means of the second output means, and second selector means for selectively outputting output data inputted from the first selector means and output data inputted from the second memory 2. A test pattern generator as set forth in claim 1, characterized in that said second memory comprises a plurality of high-speed memories, and an output selector for selecting the output data of the plurality of high-speed memories.

3. A test pattern generator as set forth in claim 1, characterized in that said second memory comprises a plurality of high-speed memories, and an output selector for selecting the output data of the plurality of high-speed memories.

4. A test pattern generator comprising:
a plurality of algorithmic pattern generating units; and
a multiplexer connected to said algorithmic pattern generating units for taking algorithmic patterns generated from the generating units and selectively outputting the patterns;
wherein each of said algorithmic pattern generating units comprises an algorithmic pattern generator, a memory coupled to said generator for storing the generated patterns, an address indication means coupled to said memory for indicating the stored address of the memory, a control circuit coupled to the memory for controlling the data input to the memory and the data output therefrom, and means for transmitting the algorithmic patterns read from the memory into the multiplexer.

5. A test pattern generating device comprising:
first output means including a first group of memories having test patterns stored therein and holding address means for holding addresses to access said memories, interleave controller means for supplying control signals for inputting respective address signals into said holding address means and for controlling an interleave operation of said memories by inputting address signals in sequence to said first group of memories and first selector means for selectively outputting output data from said first group of memories in response to a select signal supplied from said interleave controller;
second output means including a second memory for storing test patterns corresponding to a discontinuous address and a continuous address subsequent to the discontinuous address of said address signals and memory access controller means for controlling a reading of a test pattern from said second memory when said discontinuous address signal is generated during reading of the test pattens of the first group of memories of said first output means; and
select means composed of a select controller for controlling operation of the interleave controller means of the first output means and the memory access controller means of the second output means, and second selector means for selectively outputting output data provided from the first selector means and output data provided from the second memory.

6. A test pattern generating device comprising a plurality of algorithmic pattern generating units each for generating a memory test pattern; a memory for temporarily storing an output of the algorithmic pattern generating units, means for indicating a stored address in the memory during writing and reading of a test pattern to and from the memory; control means for applying a start and stop control signal to said algorithmic pattern generating means, a control signal for writing and reading of said memory and a control clock signal for setting an initial address for said address indicating means and a controlling clock signal; a plurality of pattern generating units having a read output from said memory as an output memory test pattern; and selecting means for sequentially selecting these memory test pattern outputs in response to a select signal from said control means.

* * * * *